US007251143B2

(12) United States Patent
Magnoux et al.

(10) Patent No.: US 7,251,143 B2
(45) Date of Patent: Jul. 31, 2007

(54) DEVICE AND METHOD FOR LOCKING AND UNLOCKING AT LEAST ONE INTERFACE CARD IN A RECEIVING SYSTEM

(75) Inventors: Sebastien Magnoux, Saint Gratien (FR); Lionel Coutancier, Croisilles (FR)

(73) Assignee: Bull, SAS, Louveciennes (FR)

( * ) Notice: Subject to any disclaimer, the term of this patent is extended or adjusted under 35 U.S.C. 154(b) by 359 days.

(21) Appl. No.: 10/980,873

(22) Filed: Nov. 4, 2004

(65) Prior Publication Data

US 2005/0172936 A1 Aug. 11, 2005

(30) Foreign Application Priority Data

Feb. 6, 2004 (FR) .................................. 04 01130

(51) Int. Cl.
*H05K 7/00* (2006.01)

(52) U.S. Cl. ...................... 361/801; 361/725; 361/726; 361/727; 361/730; 361/731; 361/732; 361/740; 361/741; 361/747; 361/754; 361/756; 361/759

(58) Field of Classification Search ................ 361/801, 361/725–727, 730–732, 740–741, 747, 754, 361/756, 759, 796–798
See application file for complete search history.

(56) References Cited

U.S. PATENT DOCUMENTS 4,949,035 A 8/1990 Palmer, II.
6,767,223 B2 * 7/2004 Lostoski et al. ........... 439/76.1
6,775,147 B2 * 8/2004 Kim et al. .................. 361/752
6,832,927 B2 * 12/2004 Wilson et al. .............. 439/347
2003/0107878 A1 * 6/2003 Kaminski ................... 361/759
2004/0052063 A1 * 3/2004 Megason et al. ........... 361/801
2005/0146855 A1 * 7/2005 Brehm et al. ............... 361/724
2005/0201074 A1 * 9/2005 Huang ........................ 361/801
2006/0007664 A1 * 1/2006 Jing ........................... 361/801
2006/0238992 A1 * 10/2006 Chen .......................... 361/801

FOREIGN PATENT DOCUMENTS

EP 0 901 196 A2 3/1999
EP 1 172 899 A1 1/2002

* cited by examiner

*Primary Examiner*—Dean A. Reichard
*Assistant Examiner*—Hoa C. Nguyen
(74) *Attorney, Agent, or Firm*—Miles & Stockbridge, PC; Edward J. Kondracki

(57) ABSTRACT

Device for locking and unlocking at least one interface card plugged into a socket of a receiving system (2) linked to a data processing system. The device (1) comprises a box (3) mounted to the receiving system (2) and receiving at least one sliding locking/unlocking element (4*a*-4*n*) for locking/unlocking interface cards. Each of elements (4*a*-4*n*) is disposed opposite a socket in a position that blocks the access to or removal of an interface card. Each element (4*a*-4*n*) comprising an element for controlling the power supply (63) of the card, a visual element for indicating the operation and the recognition of the card, and a detecting element for detecting the intent to unlock the card. The device (1) includes a communication element that makes it possible to transmit signals between the data processing system and the device.

29 Claims, 8 Drawing Sheets

DEVICE AND METHOD FOR LOCKING AND UNLOCKING AT LEAST ONE INTERFACE CARD IN A RECEIVING SYSTEM

BACKGROUND OF THE INVENTION

1. Field of the Invention

The present invention concerns a device and a method for locking and unlocking at least one interface card in a receiving system.

2. Description of Related Art

There are known devices in the prior art for holding a PCI-card type interface card in place in a receiving system using mounting means such as a screw mount. A holding element called a bracket is attached to each end of a printed circuit of a PCI card. This element has openings or holes that allow the passage of screws. The PCI card is held in place inside the enclosure of a receiving system by screwing, for example, screws inserted into the holes of the holding element, juxtaposed with threaded holes housed in the receiving system. This device for holding a PCI card in place in a receiving system has several drawbacks. A first drawback concerns the need to use at least one supplementary tool such as a screwdriver to attach the card to or disconnect it from the receiving system. Another drawback concerns the power supply of PCI cards. In order to insert a PCI card into a computer, it is first necessary to turn off the computer. In essence, inserting a card into a computer that is running can seriously damage the card as well as the computer. This step of turning off the receiving system increases the time required for the installation of the interface card and its recognition by the receiving system.

SUMMARY OF THE INVENTION

The object of the present invention is to eliminate certain drawbacks of the prior art by offering a device for locking/unlocking at least one interface card in a receiving system.

This object is achieved by a device for locking and unlocking at least one interface card plugged into at least one socket of a receiving system linked to a data processing system, the receiving system comprising a backplane connection that makes it possible to connect the interface cards to the data processing system; the device is characterized in that it comprises a box attached by a mounting means to the receiving system and receiving one or more means for locking/unlocking interface cards, each locking and unlocking means being disposed opposite each socket in a position that blocks the access to or removal of an interface card in a socket, each locking and unlocking means comprising a means for controlling the power supply of the interface card, a visual means for indicating the activation of the interface card, a visual means for indicating the non-recognition of the interface card by the data processing system and a means for detecting the intent to unlock the interface card, and in that the device comprises a communication means allowing the transmission of signals between the computer system linked to the receiving system and the device.

According to another characteristic, each means for controlling the power supply of an interface card comprises a triggering means which, once activated by the associated locking/unlocking means, triggers the power supply system of the receiving system that powers the associated interface card.

According to another characteristic, each means for detecting the intent to unlock an interface card comprises a triggering means which, once activated, will trigger a cutoff of the power supply of the associated interface card and an end to the sending of signals from the data processing system to the interface card.

According to another characteristic, each visual means for indicating the activity (640) of an interface card is activated by the data processing system when power is supplied to the associated interface card, and in that each visual means for indicating the non-recognition of the interface card by the data processing system is activated by the latter upon activation of the means for detecting the intent to unlock the interface card, which sends a signal to the computer system, allowing the latter to stop sending signals to the interface card.

According to another characteristic, the nearly parallelepiped-shaped box comprises a front face, a rear face, a top face, a bottom face and lateral faces, the box comprising on its top face, its lateral faces and its rear face an open bracket, the bottom face of the box comprising a flat base plate; the front face of the box is open, the bracket comprising one or more recesses separated from one another by subdividing means, and in that the box comprises a flat printed circuit card disposed between the bracket and the base plate, a first insulating plate inserted between the printed circuit card and the bracket, a second insulating plate inserted between the printed circuit card and the base plate, and a shim disposed underneath the base plate; the bracket, the base plate, the printed circuit card, the first insulating plate, the second insulating plate and the shim having surface similar surface dimensions and being mounted in juxtaposition to each other by a mounting means.

According to another characteristic, a locking/unlocking means locks, by sliding onto it, a holding element attached to one of the ends of the interface card.

According to another characteristic, a locking/unlocking means comprises a sliding element that moves translationally, guided by a guide means, inside a recess of the bracket, a part of the sliding element entering and exiting through the front face of the box, the locking/unlocking means also comprising a means for locking the sliding element in the entry position or the exit position in the recess of the bracket.

According to another characteristic, the sliding element is parallelepipedic in shape and comprises a front face, a rear face, a top face, a bottom face and two lateral faces; the sliding element also comprises a parallelepipedic recess open on its front face and on its bottom face, the lateral faces of the sliding element each comprising a rear lateral face and a front lateral face of equal lengths, the height of the rear lateral face being smaller than the height of the front lateral face, thus forming a shoulder, the height of the rear face of the sliding element being equal to the height of the rear lateral faces, the recess of the sliding element being divided into two recesses, a front recess delimited by the front lateral faces and a rear recess delimited by the rear lateral faces and the rear face.

According to another characteristic, the sliding element includes a grasping means on its top face, allowing a manual translation of the sliding element inside a recess of the bracket.

According to another characteristic, the system for guiding a sliding element in a recess of the bracket comprises means for subdividing the recess or recesses of the bracket, a pair of subdividing means forming a recess, the two subdividing means being disposed parallel to one another on either side of each sliding element, a pair of subdividing means comprising either at least the two lateral faces of the bracket, or one lateral face of the bracket associated with a first rectangular tongue having a length shorter than the width of the bracket, attached to one of its longitudinal sides perpendicular to the width of the bracket on the inside of the top face of the bracket, the tongue resting against the rear face of the box, or a second and a third rectangular tongue with a shape and orientation approximately identical to the first tongue, the second and third tongues also being disposed parallel to one another, on either side of a sliding element, and in that the guide system also comprises for each recess two rectangular guide slots whose length is shorter than the width of the bracket, located on the top face of the bracket on either side of a sliding element in proximity to the subdividing elements and to the rear face of the bracket, these two guide slots making it possible to receive two protruding guide elements disposed so as to project from each rear corner of the top surface of the sliding element, these protruding guide elements having surface dimensions approximately equal to the width of a guide slot and a height greater than the height of a guide slot, the complementary nature of the protruding guide elements of the sliding element and the of guide slots of the bracket making it possible to guide the translational movement of the sliding element inside a recess of the bracket and to limit this movement on the way out.

According to another characteristic, the means for locking a sliding element inside or outside a recess of the bracket comprises complementary locking elements, respectively located on the sliding element and the bracket; the sliding element comprises a protruding locking element, which can be parallelepipedic in shape, elastically mounted on its top face, and the bracket comprises, opposite each recess and between the guide slots, a locking opening having surface dimensions approximately equal to the dimensions of the protruding locking element, the protruding locking element and the locking opening respectively being located on the sliding element and the top face of the bracket so that in the exit position of the sliding element, the latter is locked by the guide system and by the protruding locking element, whose rear face rests against the top front side of the bracket and which, in the entry position of the sliding element in the recess of the bracket, the protruding locking element is inserted into the locking opening of the bracket.

According to another characteristic, the sliding element comprises an insertion element on its top face, disposed between the rear face of the sliding element and the protruding locking element, the insertion element making it possible to insert the sliding element surmounted by the protruding locking element into the recess of the bracket.

According to another characteristic, the printed circuit card comprises a particular cutout forming one or more sections, making it possible to receive the respective sliding element or elements, each section forming an integral part of a locking/unlocking means of the device, each section being juxtaposed with a recess of the bracket and comprising:

- the means for controlling the power supply of the associated interface card, the means for controlling the power supply being of the switch type and comprising an open and/or closed state,
- the visual means for indicating the activity of the associated interface card, the visual indicating means being of the light-emitting diode type,
- the visual means for indicating the non-recognition of the associated interface card by the data processing system, the visual indicating means being of the light-emitting diode indicator type,
  - the means for detecting the intent to unlock the associated interface card, said means being of the switch type, comprising an open and/or closed state, and in that the printed circuit card includes a projecting part on one of its longitudinal ends, making it possible to receive the communication means, which comprises a connector, for example of the HPB type, soldered to the printed circuit card and connected to electrical connections of the printed circuit and connected to a link that allows the connection between the printed circuit card of the device and the backplane connection of the data processing system, the communication means making it possible to transmit to the data processing system outgoing data such as the open and/or closed state of the means for controlling the power supply and the means for detecting the intent to unlock, and incoming data such as the activation or deactivation of the visual means for indicating the activity of the associated interface card and of the visual means for indicating the non-recognition of the associated interface card, the data processing system handling the processing of these data.

According to another characteristic, each section of the printed circuit card is formed by a projecting front part located on the longitudinal front side of the printed circuit card and a rear part located on the longitudinal rear side of the printed circuit card; the projecting front part has a rectangular shape and dimensions very similar to the dimensions of the front recess of a sliding element, indentations being formed on each side of the projecting front part delimiting said front part from the rear part of the section, the width of the indentations being identical to the width of the shoulders of the sliding element; thus, in the entry position of the sliding element, the shoulders of the sliding element come to a stop in the bottom of the indentations of the section, the front part of the section being located in the front recess of the sliding element, the rear recess, the rear lateral faces and the rear face of the sliding element being disposed above the rear part of the section, the means for controlling the power supply of an interface card is disposed on the front part of the section; the means for triggering the means for controlling the power supply is activated in the exit position of the sliding element by a power supply protuberance located in the rear recess of the sliding element; the visual means for indicating the operation of the interface card is located on the rear part of the section, near the rear face of the box; the intent means is mounted underneath the printed circuit card.

According to another characteristic, the first insulating plate is juxtaposed on top of the printed circuit card and has a shape that makes it possible to cover the rear part of the sections and the longitudinal ends of the printed circuit card while leaving the communication means accessible.

According to another characteristic, the second insulating plate, disposed underneath the printed circuit card, has a shape approximately equivalent to the shape of the printed circuit card and comprises as many cutouts for the insertion of a means for detecting the intent to unlock as there are locking/unlocking means, each cutout being disposed opposite a means for detecting the intent to unlock a printed circuit card and having surface dimensions approximately identical to the surface dimensions of the means for detecting the intent to unlock, each intent cutout making it possible to receive, during the mounting of the locking/unlocking device, a means for detecting the intent to unlock.

According to another characteristic, the base plate disposed underneath the second insulating plate has a rectangular shape whose length and width are identical to the length and width of the bracket, and in that the base plate comprises as many cutouts for the insertion of a means for detecting the intent to unlock as there are locking/unlocking means, the cutouts having a size and position approximately equal to the cutouts of the second insulating plate, each cutout making it possible to receive, during the mounting of the locking/unlocking device, a means for detecting the intent to unlock.

According to another characteristic, the shim disposed under the base plate has a shape approximately equivalent to the base plate and includes as many cutouts for the insertion of a means for detecting the intent to unlock as there are locking/unlocking means, each cutout being disposed opposite a cutout of the base plate and having dimensions approximately equal to the dimensions of the cutout of the base plate, and in that the shim includes the means for mounting the locking/unlocking device in the receiving system.

According to another characteristic, the mounting means comprise two mounting tabs disposed at a distance from one another and projecting from the rear longitudinal side of the shim, and two holes, each extended by a mounting nut soldered to the shim, each hole being disposed on a projecting part of each end of the shim so as to avoid obstructing the movement of the sliding elements, the mounting tabs each being inserted into a housing of the same size located in the receiving system, and the holes being juxtaposed with threaded holes of the receiving system so that a screwing means can be inserted through them.

According to another characteristic, the bracket and the base plate are fastened together by a complementary catch system disposed between each recess of the bracket.

According to another characteristic, a complementary catch system can be constituted by a first tab attached perpendicularly by one of its ends to the base plate and directed toward the bracket and comprising an opening located near the other end of the first tab, and a second tab attached perpendicularly by one of its ends to the bracket in the direction of the base plate and comprising a hook projecting from the other end of the second tab, the hook of the second tab being inserted into the opening of the first tab, this catch system disposed between each sliding element making it possible to guide the sliding element in translation.

A second object of the present invention for eliminating certain drawbacks of the prior art is to offer a method for locking/unlocking at least one interface card in a receiving system.

This object is achieved by a method for locking/unlocking an interface card in a device for locking and unlocking an interface card, the method being characterized in that the locking of the interface card comprises the following steps:

- a step for the activation of the means for triggering at least one means for detecting the intent to unlock an associated interface card, by a user,
- a step for detecting the closed state of the means for detecting the intent to unlock the device, indicating to the data processing system the end of the sending of signals to the interface card associated with the means for detecting the intent to unlock and the cutoff of the power supply of this interface card,
- a step for the deactivation, by the data processing system, of the visual means for indicating the activation of the associated interface card, indicating the end of activation of said interface card,
- a step for the activation, by the data processing system, of the visual means for indicating the non-recognition of the associated interface card, indicating that the interface card is no longer recognized by the data processing system,
- a secured step for unlocking the interface card by manually translating the sliding element in a recess of the box, the interface card being able to be removed from the receiving system in complete safety, and in that the locking of the interface card comprises the following steps:

- a step for inserting the interface card into a socket of the receiving system, the sliding element being in the entry position in a recess of the bracket,
- a step for locking the interface card into the locking/unlocking device by manually translating the sliding element, which automatically results in the activation of the means for controlling the power supply of the interface card inserted,
- a step for the detection of the activation of the means for controlling the power supply of a new interface card and thus for the detection of the locking of a new interface card by the computer system,
- a step for the recognition of the new interface card by the data processing system and for the deactivation of the visual means for indicating the non-recognition of the new interface card,
- a step for the activation by the data processing system of the visual means for indicating the activation of the new interface card.

BRIEF DESCRIPTION OF THE DRAWINGS

Other characteristics and advantages of the present invention will emerge more clearly from the reading of the following description, given in reference to the attached drawings, in which.

DESCRIPTION OF THE PREFERRED EMBODIMENTS

The locking/unlocking device of the present invention will now be described in connection with FIGS. 1 through 7B. A large number of the elements of the device are described as having more or less parallelepipedic shapes in the embodiment presented in FIGS. 1 through 7B. Other embodiments involving different shapes are also conceivable.

Figure 1:
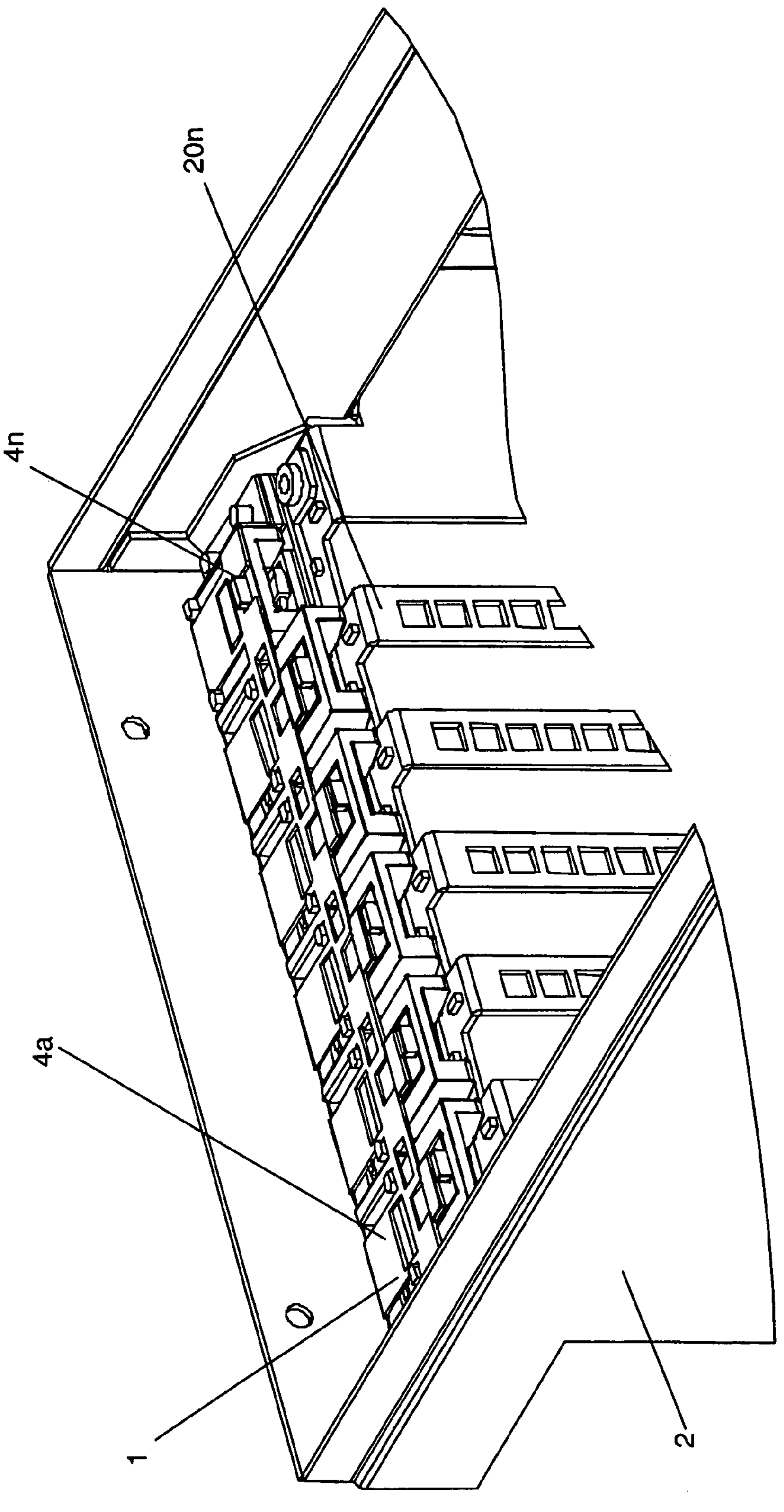
FIG. 1 represents a view in perspective of the device for locking/unlocking interface cards, mounted in a drawer of a receiving system, according to an embodiment of the present invention.
Figure 2A:
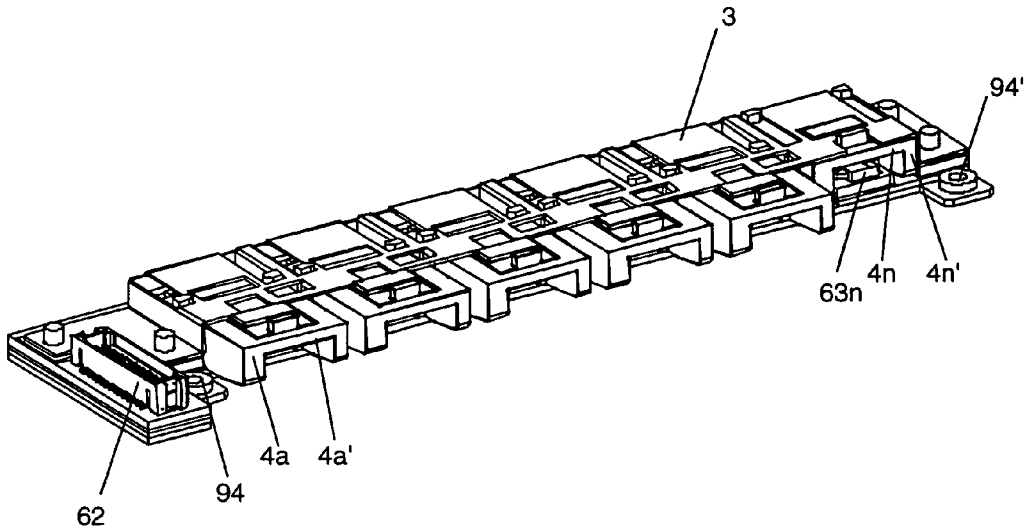
FIGS. 2A and 2B respectively represent a view in perspective of the top face and the bottom face, respectively, of the device for locking/unlocking interface cards according to an embodiment of the present invention.
Figure 2B:
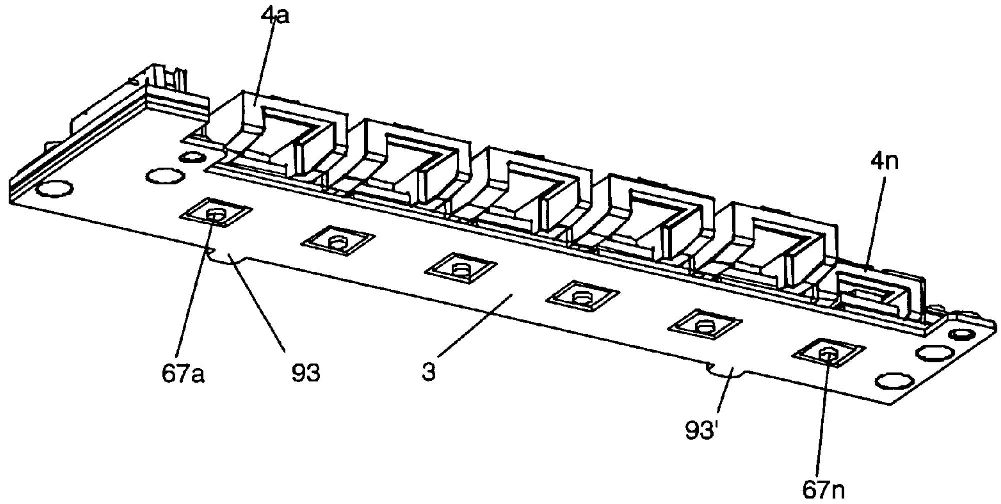
Figure 6A:
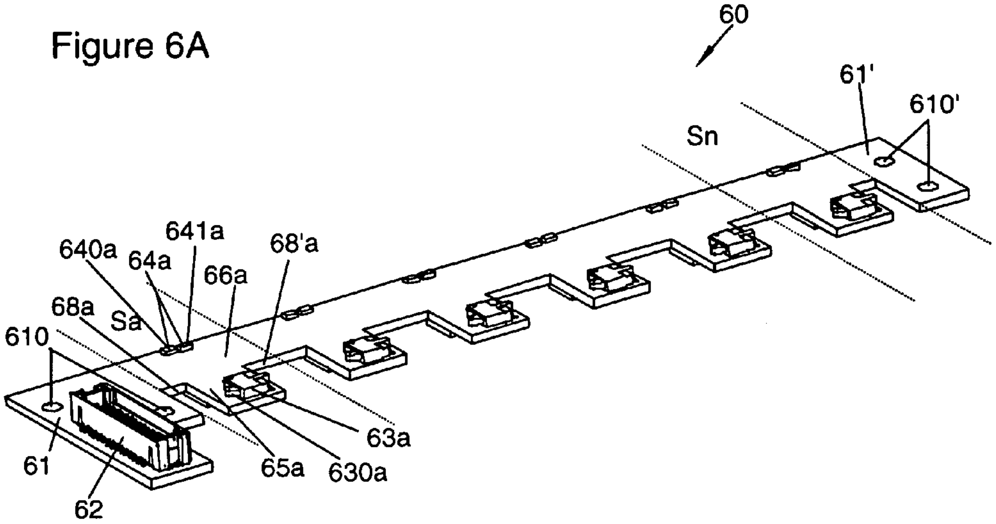
FIGS. 6A and 6B represent a view in perspective of the top face and the bottom face, respectively, of the printed circuit of the device for locking/unlocking interface cards according to an embodiment of the present invention.

FIG. 1 represents a view in perspective of the device for locking/unlocking (1) an interface card (not represented) of the standard PCI card type, the box being housed in a drawer of a receiving system (2) such as a computer. The receiving system (2) comprises one or more sockets, each comprising a pluggable element (20), making it possible to insert an interface card into it. The receiving system also comprises a backplane connection such as a printed circuit, which makes it possible to connect the various interface cards inserted to a data processing system linked to the receiving system (2). The device (1) is attached to the receiving system by a mounting means that makes it possible to hold the device crosswise in a given position so as to block the access to the sockets of the interface cards. The locking/unlocking device (1) comprises a box (3) housing at least one means for locking/unlocking (4) an interface card. As shown in FIGS. 2*a* and 2*b*, the box (3) can house several means for locking/unlocking (4*a*-4*n*) an interface card. Each locking/unlocking means includes a sliding element that enters and exits a recess of the box. Each locking/unlocking means independently locks, through the sliding of a sliding element (4'*a*-4'*n*) outside the box (3), a single interface card, or more specifically, a holding element (not represented) attached to one of the ends of the interface card. After the insertion of the interface card into the pluggable element (20) of the receiving system (2), the holding means is positioned facing a locking/unlocking means (4*a*-4*n*), the sliding element (4*a*'-4*n*') being in the entry position inside the box (3). The positioning of the sliding element (4*a*'-4*n*') over the holding element locks the latter. Each locking/unlocking means (41-4*n*) also includes a means for controlling the power supply (63*a*-63*n*) of the interface card associated with the locking/unlocking means. The activation of the control means triggers the power supply system located on the backplane printed circuit of the receiving system for supplying power to the associated interface card. Each locking/unlocking means comprises a means for detecting the intent (67*a*-67*n*) to unlock the associated interface card. The activation of the means for detecting the intent to unlock will trigger the cutoff of the power supply of the associated interface card and an end of the sending of signals from the data processing system to the interface card. Each locking/unlocking means comprises a visual means for indicating the activity (640; FIG. 6A) of the interface card, the visual means being activated when power is supplied to the interface card, and a visual means for indicating the non-recognition of the interface card by the data processing system, the visual means being activated when the data processing system stops sending signals to the interface card. The device of the present invention also comprises a communication means (62) that makes it possible to transmit signals between the device (1) and the receiving system (2). These various elements will be described in further detail below.

Figure 3:
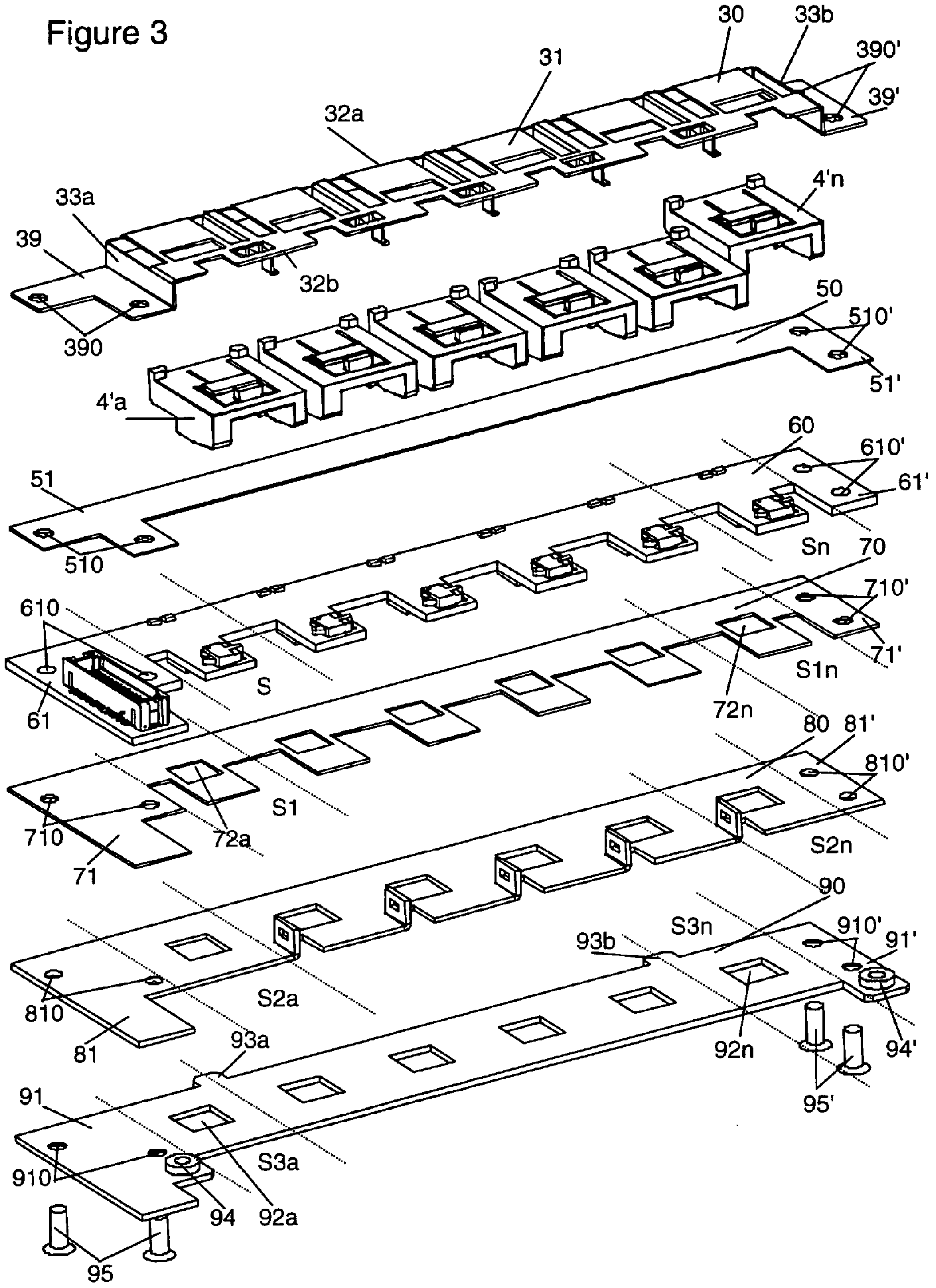
FIG. 3 represents an exploded view in perspective of the device for locking/unlocking interface cards according to an embodiment of the present invention.

FIG. 3 represents an exploded view in perspective of the device for locking/unlocking a standard interface card according to an embodiment of the present invention. In this embodiment, the box (3) of the locking/unlocking device has a parallelepipedic shape and consequently comprises a front face (32*a*), a rear face (32*b*), a top face (31), a bottom face (81) and lateral faces (33*a*-33*b*). The top face (31), the lateral faces (33*a*-33*b*) and the rear face (32*b*) of the box (3) are constituted by a bracket (30). The bottom face (82) is constituted by a base plate (80) with a flat shape. The front face (32*a*) of the box (3) is open. The box (3) also comprises a printed circuit card (60) with a flat shape, disposed between the bracket (30) and the base plate (80), a first insulating plate (50) inserted between the printed circuit card (60) and the bracket (30), a second insulating plate (70) inserted between the printed circuit card (60) and the base plate (80), and a shim (90) disposed underneath the base plate. The bracket (30), the first insulating plate (50), the printed circuit card (60), the second insulating plate (70) the base plate (80) and the shim (90) have surface similar surface dimensions, width and length, and are mounted so as to be juxtaposed with one another by a mounting means (9-9'). As shown in FIG. 3, the mounting means can include, for example, at least two holes (390, 390', 510, 510', 610, 610', 710, 710', 810, 810', 910, 910') on each longitudinal end of the elements mentioned above. The holes of each end (390, 510, 610, 710, 810, 910 and 390', 510', 610', 710', 810', 910') of these elements are juxtaposed with one another. The box (3) is fully assembled by a tightening means (94), a rivet or a bolt associated with a nut, passing through each of the holes of each end of the elements of the box (3).

Figure 4A:
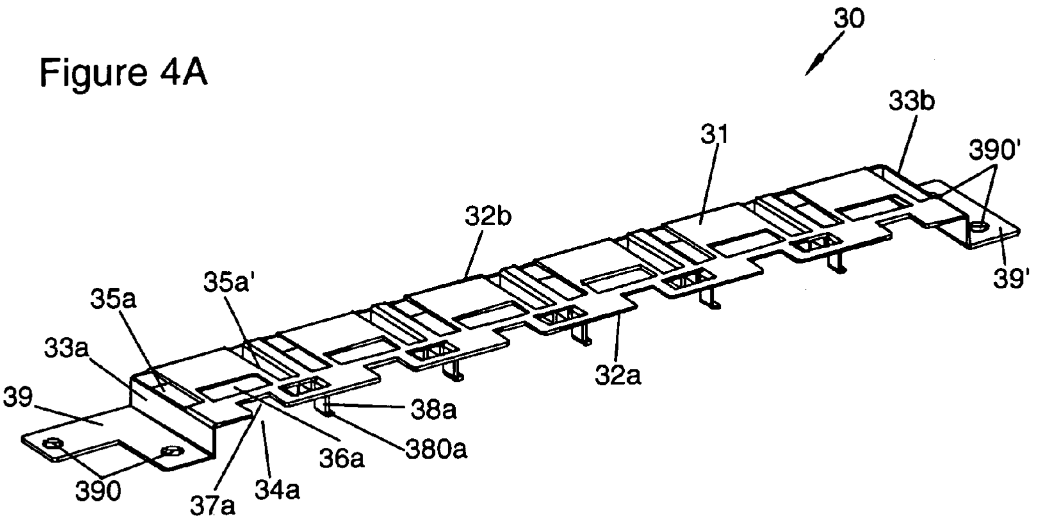
FIGS. 4A and 4B represent a view in perspective of the top face and the bottom face, respectively, of the bracket of the device for locking/unlocking an interface card according to an embodiment of the present invention.
Figure 4B:
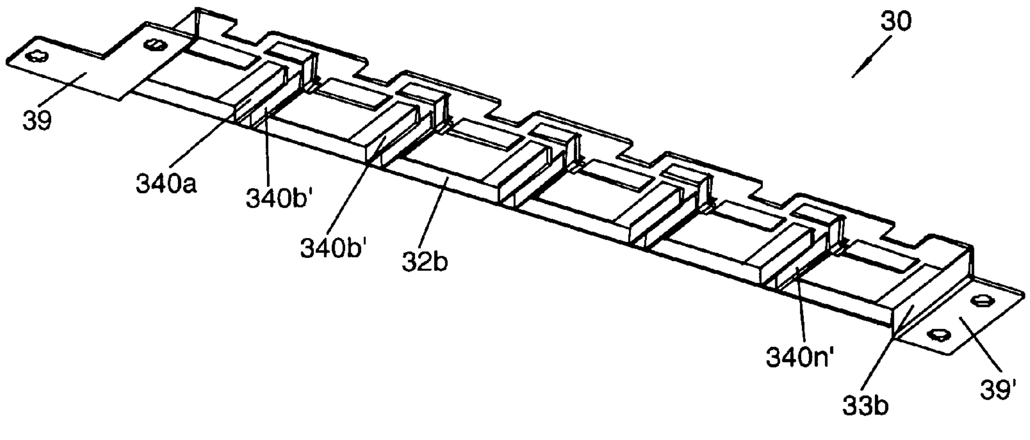

FIGS. 4A and 4B represent the bracket (30) of the box (3). The bracket includes at least one recess (34*a*) delimited by the lateral faces (33*a* and 33*b*) of the box (3). In the embodiment presented in FIGS. 4A and 4B, the bracket can include several recesses (34*a*-34*n*) separated from one another by subdividing means. A pair of subdividing means forms a recess (34*a*) inside which a sliding element moves translationally, the two subdividing means of a recess being disposed parallel to one another, on either side of each sliding element. A pair of subdividing means can correspond to at least two lateral faces (33*a*-33*b*) of the bracket (30) if the device (1) comprises only one locking/unlocking means. In reference to FIG. 4B, which represents several locking/unlocking means, a pair of subdividing means can correspond either to a lateral face of the bracket (33*a* or 33*b*) associated with a first rectangular tongue (340*a* or 340*n*) or to a second tongue (340*b*) and a third tongue (340*b*') disposed on either side of the sliding element. Each tongue (340*a*, 340*b*, 340*b*'-340*n*) has a length shorter than the width of the bracket and is attached to one of its longitudinal sides perpendicular to the width of the bracket, on the inside of the top face of the bracket, the tongue resting against the rear face of the box. For each recess, the bracket comprises a grasping opening (37*a*-37*n*) that makes it possible to receive a grasping element of a sliding element when the latter is in the entry position in the recess of the bracket. The bracket also comprises, for each recess, two guide slots (35*a*, 35*a*'-35*n*, 35*n*'). These rectangular shaped guide slots (35*a*, 35*a*'-35*n*, 35*n*'), with a length shorter than the width of the bracket (30) are located on the top face (31) of the bracket (30) on either side of a recess, in proximity to the subdividing elements and to the rear face of the bracket. These two guide slots make it possible to receive projecting guide elements of a sliding element. The bracket also comprises, opposite each recess (34*a*-34*n*) and between the guide slots (35*a*, 35*a*'-35*n*, 35*n*'), a locking opening (38*a*-38*n*). This locking opening (38*a*-38*n*), located on the top surface (31) of the bracket (30) can be for example parallelepipedic in shape and makes it possible to lock a sliding element (4*a*', 4*n*') in the entry position in the recess (34*a*, 34*n*) by receiving a protruding locking element belonging to the sliding element (4*a*'-4*n*'). The bracket includes, on its longitudinal ends (39, 39'), projecting tongues comprising the mounting elements of the bracket (390, 390').

Figure 5B:
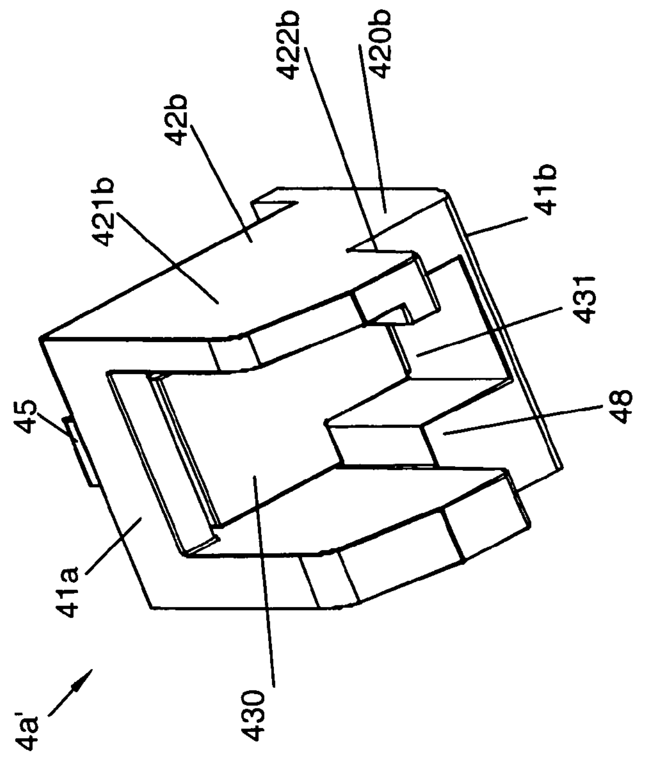
FIGS. 5A and 5B represent a view in perspective of the top face and the bottom face, respectively, of a sliding element of the device for locking/unlocking interface cards according to an embodiment of the present invention.
Figure 5A:
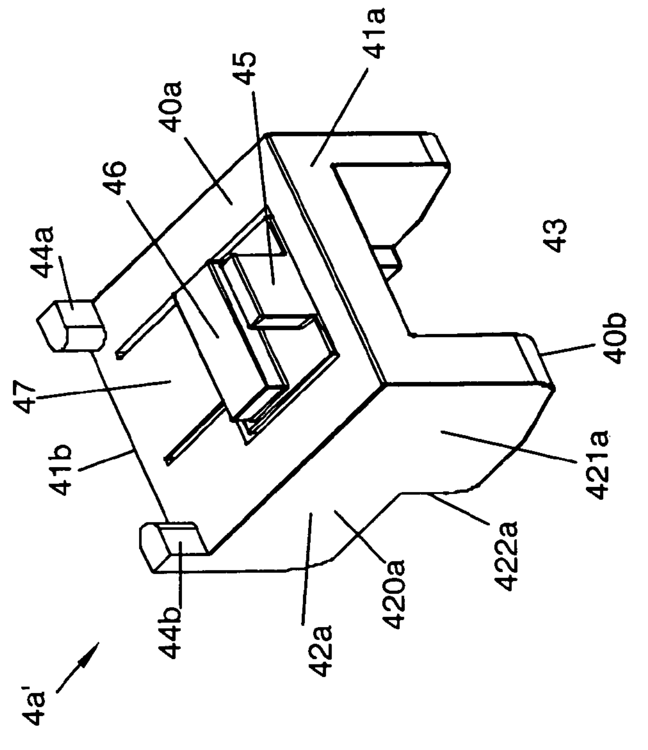

FIGS. 5A and 5B represent a sliding element belonging to a locking/unlocking means of the device of the present invention according to one embodiment. The sliding element (4*a*', 4*n*) can be parallelepipedic in shape and comprises a front face (41*a*), a rear face (41*b*), a top face (40*a*), a bottom face (40*b*) and two lateral faces (42*a*, 42*b*). The dimensions of the sliding element (4*a*') are very similar to the dimensions of a recess (34*a*) of the bracket (30). The sliding element (4*a*') also includes a recess (43), which can be parallelepipedic and is open on its front face (41*a*) and on its rear face (40*b*). The lateral faces (42*a*, 42*b*) of the sliding element each comprise a rear lateral face (420*a*, 420*b*) and a front lateral face (421*a*, 421*b*) of equal length. The height of the rear lateral face (420*a*, 420*b*) is smaller than the height of the front lateral face (421*a*, 421*b*), thus forming a shoulder (422*a*, 422*b*). The height of the rear face (41*b*) of the sliding element (4*a*') is equal to the height of the rear lateral faces (420*a*, 420*b*). The offset between the rear lateral faces (420*a*, 420*b*) associated with the rear face (41*b*) and the front lateral faces (421*a*, 421*b*), when the sliding element (4*a*') is inserted into a recess (34*a*) of the bracket (30), is located above the first insulating plate (50), the printed circuit card (60) and the second insulating plate (70). The recess (43) of the sliding element (4*a*') comprises two recesses (430, 431): a front recess (430) delimited by the front lateral faces (421*a*, 421*b*) and a rear recess (431) delimited by the rear lateral faces (420*a*, 420*b*) and the rear face (41*b*). The sliding element (4*a*') comprises a grasping element (45) that can be located, for example, on the top front face (40*a*) of the sliding element (4*a*'). In the entry position of the sliding element (4*a*') into a recess (34*a*) of the bracket (30), the grasping element (34) of the sliding element (4*a*') fits into a grasping opening (37*a*) of the bracket (30), the grasping element (45) and the grasping opening (37*a*) having identical surface dimensions. The sliding element (4*a*') also comprises two protruding guide elements (44*a*, 44*b*) disposed so as to project from each rear corner of the top face (40*a*) of the sliding element (4*a*'). These protruding guide elements (44*a*, 44*b*) have surface dimensions, width and length, approximately equal to the width of a guide slot (35*a*, 35*a*') of the bracket (30) and have a height greater than the height of a guide slot (35*a*, 35*a*'). The complementary nature of the protruding guide elements (44*a*, 44*b*) and guide slots (35*a*, 35*a*') and the subdividing means of the bracket form the guide system that makes it possible to guide the translational movement of the sliding element (4*a*') in a recess (34) of the bracket (30). The protruding guide elements (44*a*, 44*b*) and the guide slots (35*a*, 35*a*') also make it possible to limit the outgoing movement, preventing the sliding element (4*a*') from coming entirely out of the recess (34*a*) of the bracket (30) by blocking the protruding guide elements (44*a*, 44*b*) on the front end of the guide slots (35*a*, 35*a*'). The sliding element also includes a protruding locking element (46), which can be parallelepipedic in shape, elastically mounted on the top face (40*a*) of the sliding element 4*a*'). The protruding locking element (46) and the locking opening (36*a*) of the bracket are of equal surface dimensions. The height of the protruding locking element (46) is slightly larger than the height of the locking opening (36*a*). The position of the protruding locking element (46) on the sliding element and the position of the locking opening (36*a*) on the bracket depend on the entry and exit positions of the sliding element in the recess of the bracket. In the entry position, the protruding locking element (46) is housed in the locking opening (36*a*) of the bracket (30). In the exit position, the sliding element (4*a*') is locked by the protruding guide elements (44*a*, 44*b*) resting against the front ends of the guide slots (35*a*, 35*a*') and also by the protruding locking element (46), whose rear face rests against the front side of the top face (40*a*) of the bracket (30). In reference to FIGS. 5A and 5B, the sliding element (4*a*') also includes an insertion element (47) on its top face, which makes it easier to insert the sliding element (4*a*') surmounted by the protruding locking element (46) into the recess (34*a*) of the bracket (30). The insertion element (47) is disposed between the rear face of the sliding element (4*a*') and the protruding locking element (46).

A locking/unlocking means (4*a*, 4*n*) therefore comprises a translationally moving sliding element (4*a*', 4*n*') oriented by a guide means inside a recess (34*a*, 34*n*) of the bracket (30). A part of the sliding element (4*a*, 4*n*') enters and exits through the front face of the box (3). The locking/unlocking means (4*a*, 4*n*) also includes a means for locking the sliding element (4*a*', 4*n*') in the entry position or the exit position in the recess (34*a*, 34*n*) of the bracket (30).

Figure 6B:
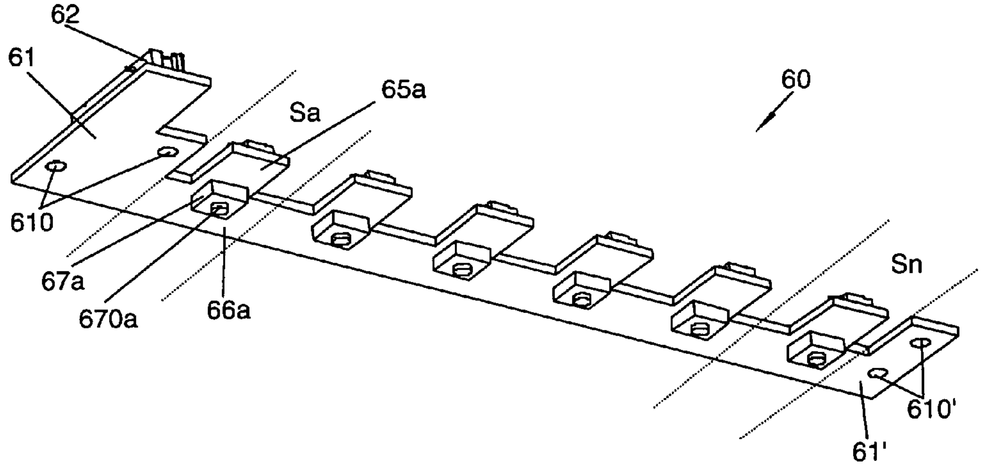

FIGS. 6A and 6B represent the printed circuit card (60) of the locking/unlocking device (1) of the present invention. The printed circuit card (60) includes the various electrical elements that make it possible to detect and indicate the insertion, activation or removal of an interface card. The printed circuit card (60) comprises a particular cutout forming one or more sections (Sa-Sn), depending on the number of locking/unlocking means (4*a*, 4*n*) present in the device (1). Each section (Sa-Sn), in the embodiment presented in FIG. 6A, is rectangular in shape and makes it possible to receive a sliding element (4*a*', 4*n*'). A section (Sa) is an integral part of a locking/unlocking device (4*a*). The length and width of a section (Sa) are of a size equal to the length and width of a recess (34*a*) of the bracket (30). Each section (Sa-Sn) is disposed opposite each recess (34*a*-34*n*) of the bracket (40). A section (Sa) of the printed circuit card (60) comprises a projecting front part (65*a*), located on the front longitudinal side of the printed card (60), and a rear part (66*a*) located on the rear longitudinal side of the printed card (60). The projecting front part (65*a*) is rectangular in shape, with length and a width whose dimensions are very similar to the dimensions of the length and the width of the front recess (340) of a sliding element (4*a*'). Two identical indentations (68*a*-68*a*') are formed on each side of the projecting front part (65*a*) delimiting the front part (65*a*) of the rear part (66*a*) of the section (Sa). The width of an indentation (68*a*) is equal to the width of a shoulder (422*a*) of the sliding element (4*a*'). Thus, when the sliding element is in the entry position in a recess (34*a*) of the bracket (30), the shoulders (422*a*, 422*b*) of the sliding element (4*a*') respectively come to rest against the bottom of the indentations (68*a*, 68*a*') of the section (Sa). The front part (65*a*) of the section (Sa) is located in the front recess (430) of the sliding element (4*a*'). The rear recess (431) the rear lateral faces (420*a*, 420*b*) and the rear face (41*b*) of the sliding element (4*a*') are disposed above the rear part (66*a*) of the section (Sa). Each section (Sa-Sn) also includes a means for controlling the power supply (63*a*-63*n*) of an interface card associated with the locking/unlocking means of the section. Each means for controlling the power supply (63*a*-63*n*) of an interface card can be a type of switch and thus can include a means for triggering the activation of the power supply of the interface card. The triggering means is activated when the sliding element slides out of the recess of the box, by a power supply protuberance (48) located in the rear recess (431) of the sliding element (4*a*'), the power supply protuberance coming to a stop against the means for triggering the power supply control means. The activation of the triggering means will result in the sending of a signal indicating the closed state of the power supply control means (63*a*-63*n*) to the data processing system linked to the receiving system. The data processing system will trigger, via the backplane connection of the receiving system, the power supply of the interface card associated with the power supply control means. The means for controlling the power supply (63*a*-63*n*) of an interface card is disposed on the front part (65*a*) of the section (Sa). Each section (Sa-Sn) also includes a means for detecting the intent to unlock (67*a*) an associated interface card. The means for detecting the intent to unlock (67*a*) can be a switch and thus can comprise a triggering means (670*a*). The triggering means (670*a*) is activated by a user wishing to remove the interface card associated with the means for detecting the intent to unlock. Once the triggering means is activated by a user, the intent detection means sends a signal to the data processing system, informing it of the open state of the means for detecting the intent to unlock and thus triggering the cutoff of the power supply of the associated interface card and the end of the sending of signals from the data processing system to said interface card. The means for detecting the intent to unlock (67*a*) can be mounted under the printed circuit card (60). Each section (Sa-Sn) includes a visual means for indicating the activation (640*a*) of an interface card, making it possible to visually inform a user that the interface card associated with the section is powered up. Each section (Sa-Sn) also includes a visual means for indicating the non-recognition (641) of an interface card, visually indicating to a user that the data processing system does not recognize the associated interface card and that the latter is not being powered by the backplane power supply system of the receiving system. The two visual signaling means (640, 641) can be light-emitting diodes. The visual signaling means (640*a*, 641*a*) are located on the rear part (66*a*) of each section (Sa-Sn) near the rear face (32*b*) of the box (3). The printed circuit card (60) also includes a communication means (62) that makes it possible to transmit the information signals between the locking/unlocking device (1) and the data processing system. The communication means (62) can be, for example, an HPB-type connector soldered to the card (60) and connected to the electrical links of the printed circuit card. The connector can accept a physical link between the device and the backplane connection of the data processing system. The printed circuit card includes electrical links that make it possible to link the means for controlling the interface card power supply (63*a*-63*n*), the means for detecting the intent to unlock (67*a*-67*n*), and the visual means for signaling (94*a*-64*n*), to the connector (62). In the embodiment of the present invention, it is the data processing system that handles the processing of the information that passes between the device (1) and the receiving system (2). The relationship between the data processing system and the device (1) is a server/slave type relationship. The connector and the physical link (62) make it possible to transmit to the data processing system outgoing data such as the open and/or closed state of the means for controlling the power supply (63*a*-63*n*) and of the means for detecting the intent to unlock (67*a*-67*n*), and incoming data such as the activation or non-activation of the visual signaling means (640*a*-640*n*; 641*a*-641*n*). In reference to FIG. 6A, the communication means (62) can be soldered to a projecting part of one of the longitudinal ends (61) of the printed circuit card (60).

The first insulating plate (50) of the device (1) is represented in FIG. 3. The first insulating plate (50) is disposed between the sliding elements (4*a*'-4*n*') inserted into the recesses (34*a*-34*n*) of the bracket (30) and the printed circuit card (60), the plate (50) being juxtaposed with the top of the printed circuit card (60). The first insulating plate (50) makes it possible to protect the printed circuit card (60) from the friction produced by the sliding elements (4*a*'-4*n*') in motion. This insulating plate (50) has a shape that makes it possible to cover the rear parts (66*a*-66*n*) of the sections (Sa, Sn) of the printed circuit card (60) and the longitudinal ends (61-61') of the printed circuit card (60), the communication means (62) not being taken into account. One of the longitudinal ends of the bracket (39) and one of the longitudinal ends of the first insulating plate (51), disposed facing the communication means (62), include a cutout that makes it possible to leave the communication means (62) accessible to a user.

The second insulating plate (70) of the device is represented in FIG. 3. The second insulating plate (70) is disposed underneath the printed circuit card (60) and has a shape approximately identical to the shape of the printed circuit card (60). The second insulating plate (70) comprises as many sections (S1*a*, S1*n*) as there are sections (Sa, Sn) on the printed circuit card, each section (S1*a*, S1*n*) of the insulating plate (70) being disposed opposite each section (Sa, Sn) of the printed card (60). Each section (S1*a*, S1*n*) of the insulating plate (70) includes a cutout (72*a*-72*n*) disposed opposite an intent detection means (64*a*-64*n*) located on the opposing section (Sa, Sn) of the printed circuit card (60). Each cutout (72*a*-72*n*) has surface dimensions that are approximately identical to the surface dimensions of the means for detecting the intent (67*a*-67*n*) to unlock. A cutout (72*a*-72*n*) makes it possible to receive, during the mounting of the locking/unlocking device, the means for detecting the intent (67*a*-67*n*) to unlock the associated interface card.

Figure 7A:
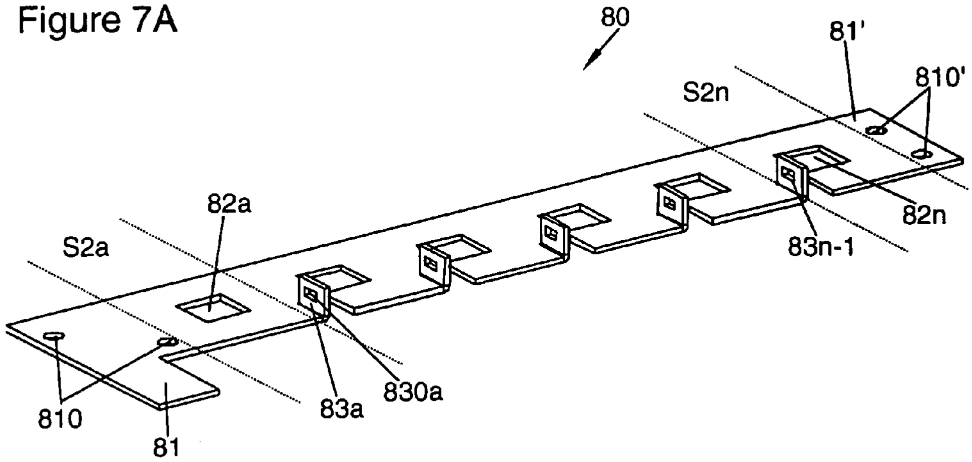
FIGS. 7A and 7B represent a view in perspective of the top face and the bottom face, respectively, of the base plate of the device for locking/unlocking an interface card according to an embodiment of the present invention.
Figure 7B:
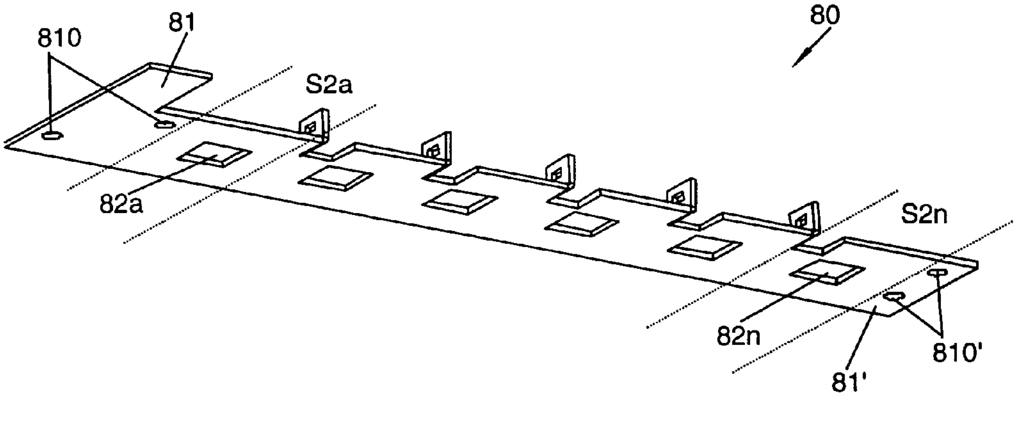

FIGS. 7A and 7B represent the base plate (80) of the locking/unlocking device of the present invention. The base plate (80) disposed underneath the second insulating plate (70) can have a rectangular shape with a length and width identical to the length and width of the bracket (30). The base plate (80), like the second insulating plate, includes as many sections (S2*a*, S2*n*) as there are sections (Sa, Sn) on the printed circuit card, each section (S2*a*, S2*n*) of the base plate (80) being disposed opposite each section (Sa, Sn) of the printed card (60). Each section (S2*a*, S2*n*) of the base plate (80) includes a cutout (82*a*-82*n*) disposed opposite an intent detection means (67*a*-67*n*) located on the opposing section (Sa, Sn) of the printed circuit card (60). Each cutout (82*a*-82*n*) has surface dimensions that are approximately identical to the surface dimensions of the intent means (67*a*-67*n*). A cutout (82*a*-82*n*) makes it possible to receive, during the mounting of the locking/unlocking device, the means for detecting the intent (67*a*-67*n*) to unlock.

The shim (90) of the locking/unlocking device (1) is represented in FIG. 3, according to an embodiment of the present invention. The shim (90) is disposed underneath the base plate (80) and has a shape substantially equal to the shape of the base plate (80). The shim (90), like the second insulating plate (70) and the base plate (80), comprises as many sections (S3*a*, S3*n*) as there are sections (Sa, Sn) on the printed circuit card, each section (S3*a*, S3*n*) of the shim (90) being disposed opposite each section (Sa, Sn) of the printed circuit card (60). Each section (S3*a*, S3*n*) of the shim (90) includes a cutout (92*a*-92*n*) disposed opposite a means for detecting the intent to unlock (67*a*-67*n*) located on the opposing section (Sa, Sn) of the printed circuit card (60). Each cutout (92*a*-92*n*) has surface dimensions that are approximately identical to the surface dimensions of the means for detecting the intent to unlock (67*a*-67*n*). A cutout (92*a*-92*n*) makes it possible to receive, during the mounting of the locking/unlocking device, the means for detecting the intent to unlock (67*a*-67*n*). The cutouts (72*a*-72*n*; 82*a*-82*n* and 92*a*-92*n*) of the second insulating plate (50) of the base plate (80) and of the shim (90) make it possible to leave the means for triggering each means for detecting the intent to unlock (64*a*-64*n*) accessible by a user when the device is assembled. In reference to FIG. 3, the shim (90) also includes the means for mounting (94-94') the box (3) to the receiving system (2). An example of a mounting means is represented in FIG. 3. In reference to this figure, the mounting means (93, 93', 94, 94') can comprise two mounting tabs (93, 93') at a distance from one another, disposed so as to project from the rear longitudinal side of the shim (90), and two holes (94, 94'), each extended by a mounting nut soldered to the shim (90). Each hole (94, 94') can be disposed on a part projecting from each end (91, 91') of the shim (90) so as to avoid obstructing the movement of the sliding elements (4*a*', 4*n*'). The mounting tabs (93, 93') are each inserted into a seat with the same dimensions located in the receiving system (2). The holes (94, 94') of the mounting means are juxtaposed with threaded holes of the receiving system (2). The box (3) and the receiving system (2) are mounted by screwing a screw (not represented) into each hole of the box (3) and of the receiving system (2). The shim (90) also makes it possible to compensate for the thickness of a shielding connector located on the interface card.

In reference to FIGS. 4A, 4B and FIGS. 5A, 5B, a catch system makes it possible to fasten the bracket (30) and the base plate (80) together. This catch system comprises one or more catching means (38*a*-38*n*, 83*a*-83*n*), each disposed between each recess (34*a*, 34*n*) of the bracket (30) if the device includes at least two recesses (34*a*). A catching means can be constituted, for example, by a first tab (38*a*-38*n*) belonging to the bracket (30) and a second tab (83*a*, 83*n*) belonging to the base plate (80). The first tab (38*a*-38*n*) is attached perpendicularly by one of its ends to the base plate (80) and is directed toward the bracket (30). The first tab (38*a*-38*n*) comprises an opening (380*a*) located near the other end. The second tab (83*a*-83*n*) is attached perpendicularly by one of its ends to the bracket (30) in the direction of the base plate (80). The second tab (83*a*, 83*n*) includes a hook (830*a*) at its other end, the hook of the second tab (83*a*, 83*n*) being inserted into the opening of the first tab (38*a*-38*n*). This catch system disposed between each sliding element (4*a*', 4*n*') is a complement of the guide system of the device (1), and also makes it possible to guide the sliding element (4*a*', 4*n*') in translation in a recess (34*a*-34*n*) of the bracket (30).

The locking/unlocking method of the present invention will now be described in reference to FIGS. 8A and 8B.

Figure 8A:
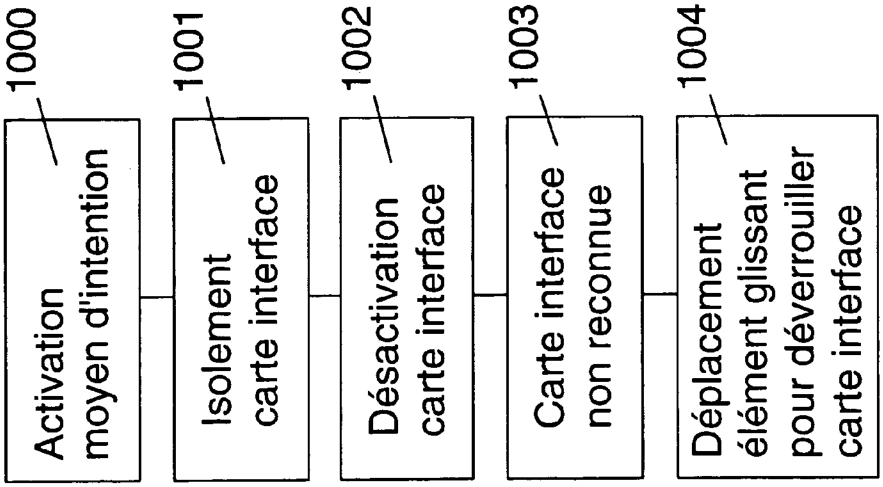
FIGS. 8A and 8B represent a logic diagram defining the method for respectively locking and unlocking an interface card in the device of the present invention.
Figure 8B:
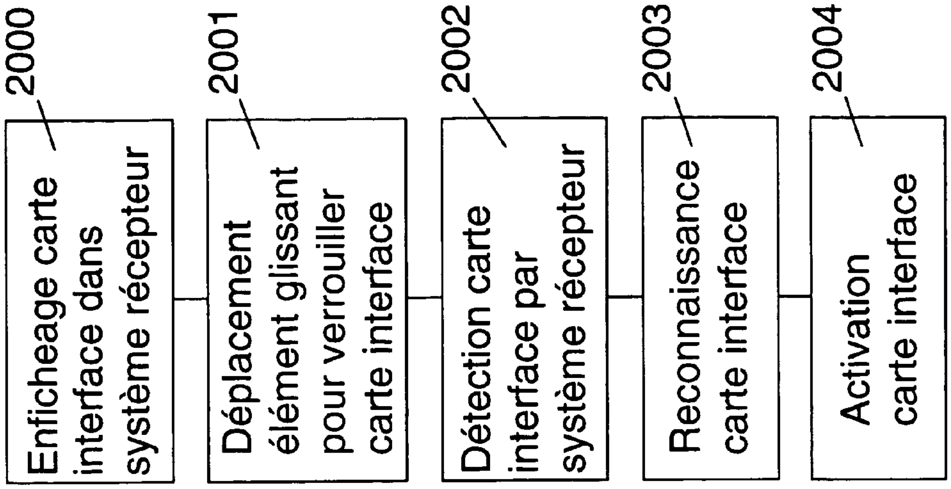

FIGS. 8A and 8B represent the method for locking/unlocking an interface card in a locking and unlocking device (1). When a card is locked, it is plugged into a pluggable means of a socket of the receiving system (2). The sliding element (4*a*') associated with the device (1) is moved forward on the holding element of the interface card, the means for controlling the power supply (63*a*) of the interface card thus being in the closed state. The means for detecting intent (67*a*) is in the open state, the first visual signaling means (640*a*) indicates that the interface card is active, and the second visual signaling means (641*a*) indicates that the data processing system recognizes the interface card. In order to unlock the interface card, a user must perform the first step (1000) by activating the means for triggering the means for detecting the intent to unlock (67*a*) associated with the interface card. This step (1000) will change the open state of the means for detecting the intent to unlock (67*a*) to a closed state. A signal indicating the closed state of the means for detecting the intent to unlock will be sent to the data processing system. The data processing system will, in a second step (1001), receive the signal from the means for detecting the intent to unlock (67*a*) instructing it to stop the sending of signals to the interface card selected, isolating the latter, and to cutoff the power supply of the same interface card. The isolation of an interface card by a control means is handled at the level of the driver of the interface card and of the configuration of the operating system of the control means. Once the interface card has been isolated, a third step (1002) is performed by the data processing system, making it possible to deactivate the first visual signaling means (640*a*), thus indicating the end of the activation of the interface card. Then a fourth step (1003) is performed by the data processing system, allowing the activation of the second visual signaling means (641*a*), thus indicating that the interface card is no longer recognized by the data processing system. A last step (1004) performed by the user is to unlock the interface card by manually translating the sliding element (4*a*') in a recess (34*a*) of the bracket (30). The translation automatically produces the open state of the means for controlling the power supply (63*a*) of the associated interface card. The interface card can be removed from the receiving system (2) in complete safety.

In order to lock the interface card, the first step (2000) consists of the selection, by a user, of a free socket in the drawer of the receiving system in order to plug an interface card into it. The sliding element (4*a*') is then in the entry position in the recess (34*a*) of the bracket (30). The user will plug the interface card into the pluggable element of the receiving system (2), the holding element of the interface card being disposed in proximity to a locking/unlocking means. A second step (2001), performed by the user, is to manually translate the sliding element (4*a*') out of the recess (34*a*) of the bracket (30). This movement automatically results in the activation of the means for triggering the means for controlling the power supply (63*a*) of the interface card, the latter switching to the closed state and triggering, by sending a signal to the data processing system, the supply of power to the interface card via the backplane connection. A third step (2002) is performed by the data processing system, and makes it possible to detect the closed state of the means for controlling the power supply (63*a*) of an interface card by receiving the signal sent and deducing that a new interface card is present in a socket of the receiving system (2). A fourth step (2003), performed by the data processing system, is the acceptance and recognition of the new interface card and the deactivation of the second visual signaling means (641*a*), thus indicating that the interface card has been recognized by the data processing system. A fifth step (2004), performed by the data processing system, is the activation of the first visual signaling means (640*a*), thus indicating the activation of the interface card.

It should be clear to those well versed in the art that the present invention allows for embodiments in many other specific forms without going beyond the scope of application of the invention as claimed. Consequently, the present embodiments should be considered illustrative, but can be modified within the range defined by the scope of the attached claims, and the invention should not be limited to the details given above.

What is claimed is:

1. A device (1) for locking and unlocking an interface card plugged into a socket of a receiving system (2) linked to a data processing system, the receiving system (2) having one or more sockets and a backplane connection for connecting interface cards to the data processing system; the device comprising a box (3) attached to the receiving system (2) and housing one or more means for locking/unlocking (4*a*-4*n*) interface cards, each locking and unlocking means (4*a*-4*n*) being disposed opposite a socket in a position that blocks the access to or removal of an interface card in the socket, each interface card having a power supply (63), each locking and unlocking means (4*a*-4*n*) comprising a means for controlling the power supply (63) of the interface card, a first visual means for indicating activation (640) of the interface card, a second visual means for indicating non-recognition (641) of the interface card by the data processing system and responsive to means for detecting an intent to unlock (67) the interface card, and a communication means (62) for the transmission of signals between the processing system linked to the receiving system (2) and the device (1).

2. A locking/unlocking device (1) according to claim 1, characterized in that the means for controlling the power supply (63) of an interface card comprises a triggering means (630*a*) adapted to be activated by an associated locking/unlocking means (4*a*-4*n*), to trigger a power supply system of the receiving system (2) that powers an associated interface card.

3. A locking/unlocking device (1) according to claim 1, characterized in that the means for detecting the intent to unlock (67) an interface card comprises a triggering means (670*a*) which, once activated, triggers a cutoff of the power supply of the associated interface card and terminates the transmission of signals from the data processing system to the interface card.

4. A locking/unlocking device (1) according to claim 1, characterized in that each visual means for indicating the activity (640) of an interface card is activated by the data processing system when power is supplied to the associated interface card, and in that each visual means for indicating the non-recognition (641) of the interface card by the data processing system is activated by the data processing system upon activation of the means for detecting the intent to unlock (67) the interface card, which sends a signal to the processing system to terminate transmission of signals to the interface card.

5. A locking/unlocking device (1) according to claim 4, characterized in that the box (3) is substantially parallelepiped-shaped and comprises a front face (32*a*), a rear face (32*b*), a top face (31), a base plate (80) and lateral faces (33*a*, 33*b*), the box (3) comprising on its top face (31), its lateral faces (33*a*, 33*b*) and its rear face (32*b*) an open bracket (30), the bottom face (80) of the box (3) comprising a flat base plate (80); the front face (32*a*) of the box (3) is open, the bracket (30) comprising one or more recesses (34*a*-34*n*) separated from one another by subdividing means, and in that the box (3) comprises a flat printed circuit card (60) disposed between the open bracket (30) and the base plate (80), a first insulating plate (50) inserted between the printed circuit card (60) and the bracket (30), a second insulating plate (70) inserted between the printed circuit card (60) and the base plate (80), and a shim (90) disposed underneath the base plate (80); the bracket (30), the base plate (80), the printed circuit card (60), the first insulating plate (50), the second insulating plate (70) and the shim (90) having similar surface dimensions and being mounted in juxtaposition to each other.

6. A locking/unlocking device (1) according to claim 1, characterized in that the locking/unlocking means (4*a*-4*n*) locks a holding element attached to one of the ends of the interface card.

7. A locking/unlocking device (1) according to claim 6, characterized in that the locking/unlocking means (4*a*-4*n*) comprises a sliding element (4*a*'-4*n*') that moves translationally, guided by a guide means inside a recess (34*a*-34*n*) of the bracket (30), a part of the sliding element (4*a*'-4*n*') entering and exiting through the front face of the box (3), the locking/unlocking means (4*a*-4*n*) also comprising a means for locking (46-36*a*) the sliding element (4*a*'-4*n*') in the entry position or the exit position in the recess (34*a*-34*n*) of the bracket (30).

8. A locking/unlocking device (1) according to claim 7, characterized in that the sliding element (4*a*'-4*n*') is parallelepiped in shape and comprises a front face (41*a*), a rear face (41*b*), a top face (40*a*), a bottom face (40*b*) and two lateral faces (42*a*-42*b*); the sliding element (4*a*'-4*n*') having a parallelepipedic recess (43) open on its front face (41*a*) and on its bottom face (40*b*), the lateral faces (42*a*, 42*b*) of the sliding element (4*a*'-4*n*') each comprising a rear lateral face (420*a*, 420*b*) and a front lateral face (421*a*, 421*b*) of equal lengths, the height of the rear lateral face (420*a*, 420*b*) being smaller than the height of the front lateral face (421*a*, 421*b*), thus forming a shoulder (422*a*, 422*b*), the height of the rear face (41*b*) of the sliding element (4*a*'-4*n*') being equal to the height of the rear lateral faces (420*a*, 420*b*), the recess (43) of the sliding element (4*a*'-4*n*') being divided into two recesses (430, 431), a front recess (430) delimited by the front lateral faces (421 *a*, 421*b*) and a rear recess (431) delimited by the rear lateral faces (420*a*, 420*b*) and the rear face (41*b*).

9. A locking/unlocking device (1) according to claim 8, characterized in that the sliding element (4*a*'-4*n*') comprises a grasping means (45) on its top face, allowing a manual translation of the sliding element (4*a*;-4*n*') inside a recess (34*a*-34*n*) of the bracket (30).

10. A locking/unlocking device (1) according to claim 9, further comprising a guide system for guiding the sliding element (4*a*'-4*n*') in a recess (34*a*-34*n*) of the bracket (30) said guide system further comprising means for subdividing (33*a*, 33*b*, 340*a*-340*n*') the recess or recesses (34*a*-34*n*) of the bracket (30), a pair of subdividing means (33*a*, 33*b*, 340*a*-340*n*') forming a recess (34*a*-34*n*), the pair of subdividing means being disposed parallel to one another on either side of each sliding element (4*a*'-4*n*'), the pair of subdividing means comprising either at least the two lateral faces (33*a*, 33*b*) of the bracket (30), or one lateral face (33*a* or 33*b*) of the bracket (30) associated with a first rectangular tongue (340*a* or 340*n*') having a length shorter than the width of the bracket (30), attached to one of its longitudinal sides perpendicular to the width of the bracket (30) on the inside of the top face (31) of the bracket (30), the tongue (340*a* or 340*n*') resting against the rear face (32*b*) of the box (3), or a second and a third rectangular tongue (340*b*-340*b*') with a shape and orientation approximately identical to the first tongue (340*a* or 340*n*'), the second and third tongues (340*b*-340*b*') also being disposed parallel to one another, on either side of a sliding element (4*a*'-4*n*').

11. A locking/unlocking device (1) according to claim 10, wherein the guide system further comprises for each recess (34*a*-34*n*) two rectangular guide slots (35*a*, 35*a*') whose length is shorter than the width of the bracket (30), located on the top face (31) of the bracket (30) on either side of a sliding element (4*a*'-4*n*') in proximity to the subdividing elements (340*b*-340*b*') and to the rear face (32*b*) of the bracket (30), said two guide slots (35*a*, 35*a*') adapted to receive two protruding guide elements (44*a*, 44*b*) disposed so as to project from each rear corner of the top surface (40*a*) of the sliding element (4*a*', 4*n*'), said protruding guide elements (44*a*, 44*b*) having surface dimensions approximately equal to the width of a guide slot (35*a*, 35*b*) and a height greater than the height of a guide slot (35*a*, 35*b*), the complementary nature of the protruding guide elements (44*a*, 44*b*) of the sliding element (4*a*'-4*n*') and of the guide slots (35*a*, 35*b*) of the bracket (30) making it possible to guide the translational movement of the sliding element (4*a*'-4*n*') inside a recess (34*a*-34*n*) of the bracket (30) and to limit said translational movement on the way out.

12. A locking/unlocking device (1) according to claim 10, comprising means for locking (46-36*a*) a sliding element (4*a*'-4*n*') inside or outside a recess (34*a*-34*n*) of the bracket (30) including complementary locking elements (46-36*a*), respectively located on the sliding element (4*a*'-4*n*') and the bracket (30); the sliding element (4*a*'-4*n*') having a protruding locking element (46), parallelepipedic in shape, and elastically mounted on its top face (40*a*).

13. A locking/unlocking device according to claim 12, wherein the bracket (30) comprises, opposite each recess (34*a*-34*n*) and between guide slots (35*a*, 35*b*), a locking opening (36*a*) having surface dimensions approximately equal to the dimension of the protruding locking element (46), the protruding locking element (46) and the locking opening (36*a*) respectively being located on the sliding element (4*a*'-4*n*') and the top face of the bracket (30) so that in an exit position of the sliding element (4*a*'-4*n*'), the element is locked by the guide system and by the protruding locking element (46) whose rear face rests against the top front side (31) of the bracket (30) and which, in the entry position of the sliding element (4*a*'-4*n*') in the recess (34*a*-34*n*) of the bracket (30), the protruding locking element (46) is inserted into the locking opening (36*a*) of the bracket (30).

14. A locking/unlocking device (1) according to claim 13, characterized in that the sliding element (4*a*'-4*n*') comprises an insertion element (47) on its top face (40*a*), disposed between the rear face (41*b*) of the sliding element (4*a*'-4*n*') and the protruding locking element (46), the insertion element (47) making it possible to inert the sliding element (4*a*'-4*n*'), surmounted by the protruding locking element (46), into the recess (34*a*-34*n*) of the bracket (30).

15. A locking/unlocking device (1) according to claim 1, characterized in that the interface and is a printed circuit card (60) having a cutout forming one or more sections (Sa-Sn), for receiving the respective sliding element or elements (4*a*'-4*n*'), each section (Sa-Sn) forming an integral part of the locking unlocking means (4*a*-4*n*) of the device (1), and each section (Sa-Sn) being juxtaposed with a recess (34*a*-34*n*) of a bracket (30) on the box (3).

16. A locking/unlocking device according to claim 15 wherein the means for controlling the power supply (63*a*) of the associated interface card, being of the switch type and comprising an open and/or closed state, the first visual means for indicating (640*a*) the activity of the associated interface card, being a light-emitting diode type, the second visual means for indicating (641*a*) the non-recognition of the associated interface card by the data processing system, being a light-emitting diode indicator type, and the means for detecting the intent (67*a*) to unlock the associated interface card, being a switch type, comprising an open and/or closed state.

17. A locking or unlocking device according to claim 15 wherein the printed circuit card (60) includes a projecting part on a longitudinal end (61), for receiving the communication means (62), a connector, affixed to the printed circuit card (60) and connected to electrical connections of the printed circuit and connected to a link that allows the connection between the printed circuit card of the device and a backplane connection of the data processing system.

18. A locking or unlocking device according to claim 17 wherein the communication means (62) transmits to the data processing system outgoing data such as the open and/or closed state of the means for controlling the power supply (63*a*) and the means for detecting the intent to unlock (67*a*), and incoming data such as the activation or deactivation of the means for visually indicating the activity (64*a*) of the associated interface card and of the visual means for indicating the non-recognition (64*a*) of the associated interface card, the data processing system handling the processing of these data.

19. A locking/unlocking device (1) according to claim 17, characterized in that each section (Sa-Sn) of the printed circuit card (60) is formed by a projecting front part (65*a*) located on the longitudinal front side of the printed circuit card (60) and a rear part (66*a*) located on the longitudinal rear side of the printed circuit card (60).

20. A locking/unlocking device according to claim 19 wherein the projecting front part (65*a*) has a rectangular shape and dimensions substantially equal to the dimensions of the front recess (430) of a sliding element (4*a*'-4*n*'), indentations (68*a*, 68*a*') being formed on each side of the projecting front part (65*a*) delimiting said front part (65*a*) from the rear part (66*a*) of the section (Sa-Sn), the width of the indentations (68*a*, 68*a*') being identical to the width of shoulders (422*a*, 422*b*) of the sliding element (4*a*'-4*n*'); such that, in the entry position of the sliding element (4*a*'-4*n*'), the shoulders (422*a*, 422*b*) of the sliding element (4*a*', 4*n*') come to a stop in the bottom of indentations (68*a*, 68*a*') of the section (Sa-Sn), the front part (65*a*) of the section (Sa-Sn) being located in a front recess (430) of the sliding element (4*a*'-4*n*'), and a rear recess (341), a rear lateral faces (420*a*, 420*b*) and a rear face (41*b*) of the sliding element (4*a*'-4*n*') being disposed above the rear part (66*a*) of the section (Sa-Sn).

21. A locking/unlocking device (1) according to claim 20 wherein the means for controlling the power supply (63*a*) of an interface card is disposed on the front part (65*a*) of the section (Sa-Sn); and the means for triggering (630*a*) the means for controlling the power supply (63*a*) is activated in the exit position of the sliding element (4*a*'-4*n*') by a power supply protuberance (48) located in a rear recess (431) of the sliding element (4*a*'-4*n*'); the visual means for indicating (64*a*) the operation of the interface card is located on the rear part (66*a*) of the section(Sa-Sn), near the rear face (32*b*) of the box (3); and intent means (67*a*) is mounted underneath the printed circuit card (60).

22. A locking/unlocking device (1) according to claim 15, characterized in that a first insulating plate (50) is juxtaposed on top of the printed circuit card (60) and has a shape that covers a rear part (66*a*) of the sections (Sa-Sn) and the longitudinal ends (61, 61') of the printed circuit card (60) while leaving the communication means (62) accessible.

23. A locking/unlocking means (1) according to claim 22, characterized in that a second insulating plate (70) is disposed underneath the printed circuit card (60) and has a shape approximately equivalent to the shape of the printed circuit card (60) and includes as many cutouts (72*a*-72*n*) for the insertion of a means for detecting the intent to unlock (67_a_) as there are locking/unlocking means (4_a_-4_n_), each cutout (72_a_-72_n_) being disposed opposite a means for detecting the intent to unlock (67_a_) a printed circuit card (60) and having surface dimensions approximately identical to the surface dimensions of the means for detecting the intent to unlock (67_a_), each intent cutout (72_a_-72_n_) making it possible to receive, during the mounting of the locking/unlocking device (1), a means for detecting the intent to unlock (67_a_).

24. A locking/unlocking device (1) according to claim 23, characterized in that a base plate (80) is disposed underneath the second insulating plate (70) and has a rectangular shape whose length and width are identical to the length and width of the bracket (30), and in that the base plate (80) includes as many cutouts (82_a_-82_n_) for the insertion of a means for detecting the intent to unlock (67_a_) as there are locking/unlocking means (4_a_-4_n_), the cutouts (82_a_-82_n_) having a size and a position approximately equal to the cutouts (72_a_-72_n_) of the second insulating plate (70), each cutout (82_a_-82_n_) making it possible to receive, during the mounting of the locking/unlocking device (1), a means for detecting the intent to unlock (67_a_).

25. A locking/unlocking device (1) according to claim 24, characterized in that a shim (90) is disposed underneath the base plate (80) and has a shape approximately corresponding to the base plate (80) and includes as many cutouts (92_a_-92_n_) for the insertion of a means for detecting the intent to unlock (67_a_) as there are locking/unlocking means (4_a_-4_n_), each cutout (92_a_-92_n_) being disposed opposite a cutout (82_a_-82_n_) of the base plate (80) and having dimensions approximately equal to the dimensions of the cutout (82_a_-82_n_) of the base plate (80), and the shim (90) including means for mounting (93_a_, 93_b_, 94_a_, 94_b_) the locking/unlocking device (1) into the receiving system (2).

26. A locking/unlocking device (1) according to claim 25, characterized in that the means for mounting (93_a_, 93_b_, 94_a_, 94_b_) comprise two mounting tabs (93_a_, 93_b_) disposed at a distance from one another, projecting from the rear longitudinal side of the shim (90) and two holes (94_a_, 94_b_), each extended by a mounting nut soldered to the shim (90), each hole (94_a_, 94_b_) being disposed on a projecting part of each end of the shim (90) so as to avoid obstructing the movement of the sliding elements (4_a_'-4_n_'), the mounting tabs (93_a_, 93_b_) each being inserted into a seat of the same size located in the receiving system (2) and the holes (94_a_, 94_b_) being juxtaposed with threaded holes of the receiving system (2) so that a tightening means can be inserted through them.

27. A locking/unlocking device (1) according to claim 15, characterized in that the bracket (30) and a base plate (80) disposed beneath the printed circuit art are fastened together by a complementary catch system (38_a_-83_a_) disposed between each recess (34_a_-34_n_) of the bracket (30).

28. A locking/unlocking device (1) according to claim 27, characterized in that the complementary catch system (38_a_-83_a_) comprises a first tab (83_a_) attached perpendicularly by one of its ends to the base plate (80) and directed toward the bracket (30) and comprising an opening (830_a_) located near an other end of the first tab (83_a_), and a second tab (38_a_) attached perpendicularly by one of its ends to the bracket (30) in the direction of the base plate (80) and comprising a hook (380_a_) projecting from an other end of the second tab (38_a_), the hook (380_a_) of the second tab (38_a_) being inserted into an opening (380_a_) of the first tab, (83_a_) said catch system being disposed between each sliding element (4_a_'-4_n_'), for guiding the sliding element (4_a_'-4_n_') in translation.

29. A method for locking/unlocking an interface card in a device for locking and unlocking (1) an interface card, the method being characterized in that the unlocking of the interface card comprises the following steps:

a step (1000) for activation of means for triggering (670_a_) at least one means for detecting an intent to unlock (67_a_) an associated interface card, by a user, a step (1001 for detecting a closed state of means for detecting the intent to unlock (67_a_) the device (1), and indicating to a data processing system terminations of the sending of signals to the interface card associated with the means for detecting the intent to unlock (67_a_) and cutoff of the power supply of said interface card, a step (1002) for the deactivation, by the data processing system, of visual means for indicating activation (640_a_) of the associated interface card, indicating the end of activation of said interface card, a step (1003) for activation, by the data processing system, of visual means for indicating non-recognition (641_a_) of the associated interface card, indicating that the interface card is no longer recognized by the data processing system, a secured step (1004) for unlocking the interface card by manually translating a sliding element (4_a_'-4_n_') in a recess (34_a_-34_n_) of a box (3), the interface card being able to be removed from a receiving system for the card (2) in complete safety, and in that the locking of the interface card comprises the following steps:

a step (2000) for inserting the interface card into a socket of a receiving system (2), a sliding element (4_a_'-4_n_') being in the entry position in a recess (34_a_-34_n_) of a bracket (30), a step (2001) for locking the interface card into a locking/unlocking device (1) by manually translating the sliding element (4_a_'-4_n_'), which automatically results in the activation of means for controlling the power supply (63_a_) of the interface card inserted, a step (2002) for detection of the activation of the means for controlling the power supply of a new interface card, and thus for the detection of the locking of a new interface card, by the data processing system, a step (2003) for recognition of the new interface card by the data processing system and for the deactivation of the visual means for indicating (641_a_) the non-recognition of the new interface card, and a step (2004) for the activation by the data processing system of the visual means for indicating (640_a_) the activation of the new interface card.

* * * * *

UNITED STATES PATENT AND TRADEMARK OFFICE

CERTIFICATE OF CORRECTION

PATENT NO. : 7,251,143 B2
APPLICATION NO. : 10/980873
DATED : July 31, 2007
INVENTOR(S) : Magnoux et al.

It is certified that error appears in the above-identified patent and that said Letters Patent is hereby corrected as shown below:

Column 18, Line 20, replace the words “claim 17” with the words --claim 15--.

Signed and Sealed this

Sixth Day of November, 2007

JON W. DUDAS
*Director of the United States Patent and Trademark Office*